(12) United States Patent
Gao et al.

(10) Patent No.: US 7,453,673 B2
(45) Date of Patent: Nov. 18, 2008

(54) MAGNET TUNNELING JUNCTION WITH RF SPUTTERED GALLIUM OXIDE AS INSULATION BARRIER FOR RECORDING HEAD

(75) Inventors: Zheng Gao, Savage, MN (US); Song S. Xue, Eden Prairie, MN (US); Eric Leroy Granstrom, Golden Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 376 days.

(21) Appl. No.: 11/054,455

(22) Filed: Feb. 9, 2005

(65) Prior Publication Data

US 2006/0176619 A1    Aug. 10, 2006

(51) Int. Cl.
G11B 5/39 (2006.01)
(52) U.S. Cl. .................................... 360/324.2
(58) Field of Classification Search ............ 360/324.1, 360/324.2; 257/43; 428/811.1, 815
See application file for complete search history.

(56) References Cited

U.S. PATENT DOCUMENTS

| | | | |
|---|---|---|---|
| 5,985,471 A * | 11/1999 | Sato et al. ................. 428/815 |
| 6,359,289 B1 * | 3/2002 | Parkin ........................ 257/43 |
| 6,597,548 B1 * | 7/2003 | Yamanaka et al. ....... 360/324.2 |
| 6,730,395 B2 * | 5/2004 | Covington ............... 428/811.1 |
| 6,791,806 B1 * | 9/2004 | Gao et al. ................ 360/324.2 |
| 7,054,118 B2 * | 5/2006 | Daughton et al. ........ 360/324.2 |
| 2005/0002126 A1 * | 1/2005 | Fujiwara et al. .......... 360/324.1 |
| 2006/0018057 A1 * | 1/2006 | Huai ....................... 360/324.2 |
| 2006/0291105 A1 * | 12/2006 | Chang et al. ............. 360/324.2 |

* cited by examiner

*Primary Examiner*—Tianjie Chen
(74) *Attorney, Agent, or Firm*—Kinney & Lange, P.A.

(57) ABSTRACT

A magnetic tunneling junction device has a fixed ferromagnetic layer, a free ferromagnetic layer, and an insulating tunnel barrier layer made of gallium oxide. The insulating tunneling barrier layer is deposited by RF sputtering of gallium oxide. The magnetic tunneling junction device has a resistance area product less than 7 $\Omega \cdot \mu m^2$.

17 Claims, 6 Drawing Sheets

MAGNET TUNNELING JUNCTION WITH RF SPUTTERED GALLIUM OXIDE AS INSULATION BARRIER FOR RECORDING HEAD

This invention relates to a magnetic tunneling junction device with a RF sputtered gallium oxide insulating barrier between the free and fixed ferromagnetic layers.

BACKGROUND OF THE INVENTION

Magnetic tunneling junction (MTJ) devices are made of two ferromagnetic layers separated by a thin, non-magnetic insulating layer. MTJ devices are used in magnetoresistive (MR) heads and in magnetic random access memory (MRAM) devices.

The two ferromagnetic layers of a MTJ are selected to have different responses to magnetic fields, so that the relative orientation of their magnetic moments can be varied with an external magnetic field. One ferromagnetic layer of a MTJ device has a fixed magnetic orientation, while the other ferromagnetic layer is free to change its magnetic orientation. These two ferromagnetic layers are usually called the fixed ferromagnetic layer and the free ferromagnetic layer.

The insulating layer that separates the fixed and free ferromagnetic layers is usually called the tunneling barrier layer. The tunneling barrier layer derives its name from the fact that it is sufficiently thin that electrons are able to quantum-mechanically tunnel through it. When a voltage is applied across the pair of ferromagnetic layers, electrons travel between the two magnetic layers by tunneling through the tunneling layer.

The current through a MTJ device depends on the relative magnetic orientation of the fixed ferromagnetic layer and the free ferromagnetic layer. Resistance to the current is a maximum when the magnetic orientations of the two ferromagnetic layers are anti-parallel. Resistance is a minimum when the magnetic orientations of the two ferromagnetic layers are parallel. The difference between the maximum and minimum resistance divided by the resistance of the device ($\Delta R/R$) is commonly referred to as the magnetoresistance (MR) ratio. A large MR ratio is desirable to maximize the signal to noise ratio (SNR).

Another important parameter of a MTJ device is the resistance area (RA) product. Because the two ferromagnetic layers of a MTJ device are excellent conductors and can be considered to have no resistance, the resistance of the insulating tunnel barrier layer of a device determines the total resistance of a MTJ device. Low resistance is desirable in a MTJ device. However, the resistance of a MTJ device increases as the area of the device decreases. Thus, as efforts are made to decrease the size of MTJ devices, the resistance of the devices increases.

Because resistance goes up as area goes down in a MTJ device, these two parameters are inherently in conflict. Therefore, the product of resistance multiplied by area, the RA product, is useful as a parameter for MTJ devices. A small RA product is desirable.

The tunneling barrier layer is the most important layer in a MTJ device, because performance of the device is highly dependent on the tunneling barrier material. The material most commonly used for the tunneling barrier layer of an MTJ device is aluminum oxide ($Al_2O_3$). However, RA products increase exponentially with the thickness of an $Al_2O_3$ tunneling barrier layer. Since low RA products are necessary for applications such as recording heads, and creating very thin layers is problematic, $Al_2O_3$ has not been successful as a tunneling barrier layer in low RA applications.

Recently, gallium oxide ($Ga_2O_3$) has emerged as an alternative to aluminum oxide for use as the tunneling barrier layer of a MTJ device. For example, U.S. Pat. No. 6,359,289 discloses use of a gallium oxide tunneling barrier layer. MTJ devices made with a gallium oxide tunneling barrier layer disclosed in the '289 patent have lower RA products, while maintaining relatively high MR ratios. However, for MTJ devices to be useful as read heads, even lower RA products are needed.

The most common and successful method of forming a tunneling barrier layer consists of depositing a metal layer and then using either natural oxidation or plasma oxidation to create the metal oxide. For example, the gallium oxide tunneling barrier layer disclosed in the '289 patent is formed by sputter deposition of gallium followed by plasma oxidation to create gallium oxide. MTJ devices with gallium oxide tunneling barrier layers disclosed in the '289 patent show maximum MR ratios of 22% at room temperature, with RA products of 800,000$\Omega \cdot \mu m^2$. A MTJ device with such a large RA product would not be useful as a recording head in a magnetic storage device.

Therefore, in order to meet the requirements for use of MTJ devices in recording heads, it is desirable to develop MTJ devices with gallium oxide tunneling barrier layers that have lower RA products, while maintaining high MR ratios. Also, in order to control stack uniformity, it is desirable to form a tunneling barrier layer without oxidation or nitridation. It is also desirable to have a thick barrier, without sacrificing RA products or MR ratios.

BRIEF SUMMARY

The invention is a magnetic tunnel junction device with a gallium oxide tunnel barrier layer made by RF sputtering that achieves a RA product of less than 7$\Omega \cdot \mu m^2$. The gallium oxide layer is created by radio frequency (RF) sputtering of gallium oxide.

DETAILED DESCRIPTION

MTJ devices with a sufficiently low RA product and a sufficiently high MR ratio for use in recording head applications are needed, so it is desirable to develop alternative tunneling barrier materials. In the invention, a tunneling barrier layer of gallium oxide is deposited using RF sputtering. This results in a MTJ device with a significantly reduced RA product, while maintaining a sufficiently high MR ratio for use in recording heads and other applications.

Figure 1:
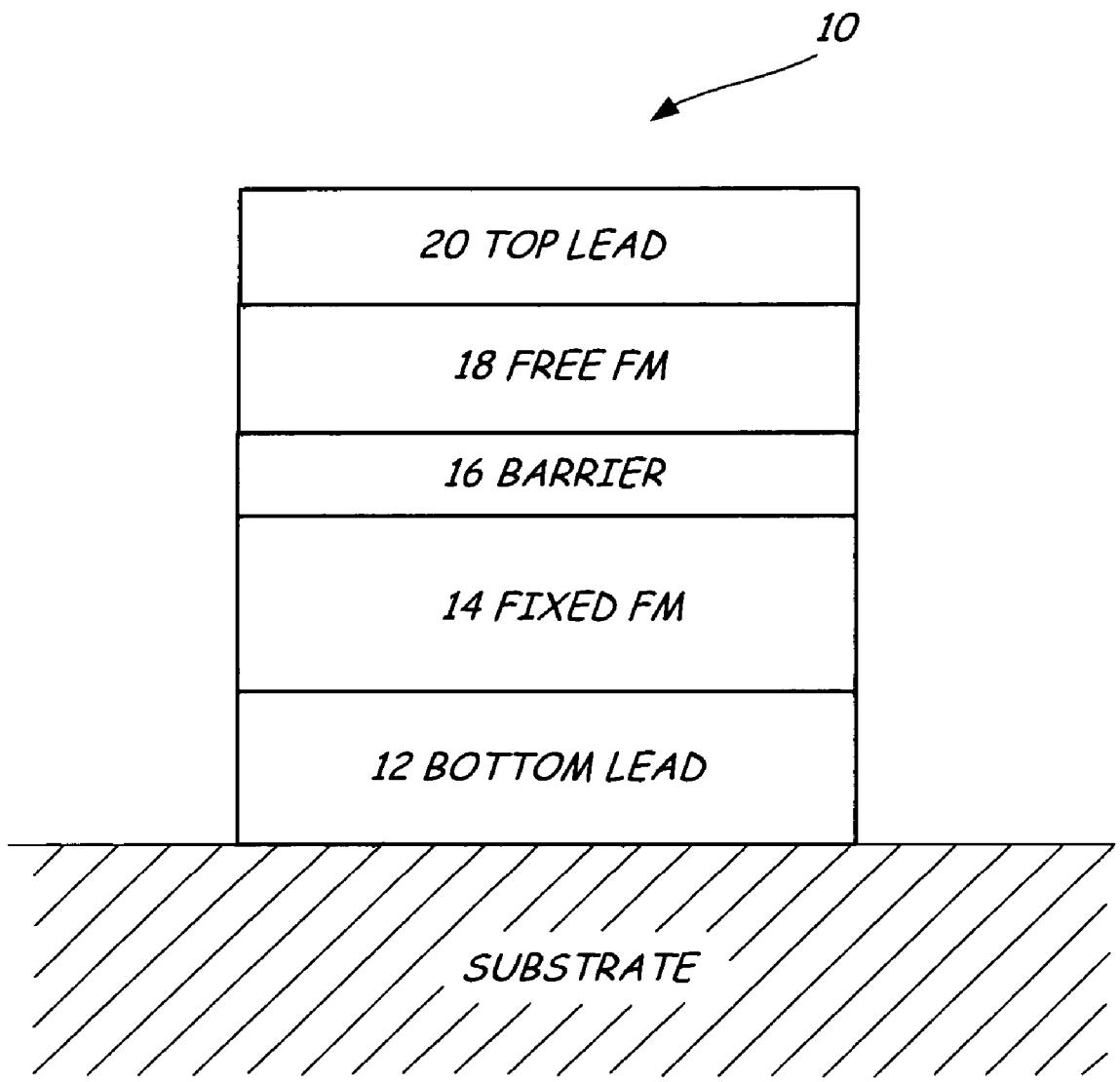
FIG. 1 shows a cross-sectional view of a MTJ device.

FIG. 1 is a cross-sectional view of MTJ device 10. MTJ device 10 includes bottom electrical lead 12, fixed ferromagnetic layer 14, insulating tunneling layer 16, free ferromagnetic layer 18, and top electrical lead 20. When a voltage is applied across MTJ device 10, electrons travel between fixed ferromagnetic layer 14 and free ferromagnetic layer 18 by tunneling through tunneling layer 16.

Fixed ferromagnetic layer 14 is made of a high coercivity material whose magnetic moment does not rotate in the presence of an applied magnetic field, such as the magnetic field caused by the write current applied to a memory cell or the magnetic field from the recorded magnetic layer in a magnetic recording disk.

Free ferromagnetic layer 18 is made of a material whose magnetic moment will rotate in the presence of an applied magnetic field. Thus, the relative orientation of the magnetic moments of the fixed ferromagnetic layer 14 and free ferromagnetic layer 18 will depend on the direction of an applied magnetic field. Free ferromagnetic layer 14 is typically grown on top of tunneling barrier layer 16. Free ferromagnetic layer 18 may be made of any appropriate ferromagnetic material, such as iron or cobalt, or some combination of materials, such as NiFe, CoFe, CoNiB or CoNiFe.

Tunneling barrier layer 16 is formed by RF sputtering of gallium oxide. In contrast to the prior art, in which a layer of metallic gallium is first applied and then subsequently oxidized, applying tunneling barrier layer 16 by RF sputtering eliminates the metal oxidation process. Much of the problem with non-uniformity of tunneling barrier layer 16 arises from the oxidation process. This non-uniformity derives not only from problems controlling the thickness of tunneling barrier layer 16, but also from grain size and oxygen distribution. Direct application of gallium oxide by RF sputtering improves the uniformity of tunneling barrier layer 16, thereby improving performance of the device.

RF sputtered gallium oxide tunneling barrier layer 16 can also be subsequently oxidized or nitrified. This may also improve performance of the device. This oxidation could consist of any oxidation technique, such as natural oxidation, plasma oxidation UF, radical oxidation or any other oxidation process. MTJ device 10 with a RF sputtered gallium oxide tunneling barrier 16 can sustain annealing temperature of more than 270° C. without significant degradation of RA products or MR ratios.

Deposition of gallium oxide tunneling barrier layer 16 by RF sputtering results in MTJ device 10 having a substantially lower RA product than any prior art device, while maintaining MR ratios that are high enough for use in magnetic recording heads, as is explained further below with respect to FIGS. 2-5.

Figure 2:
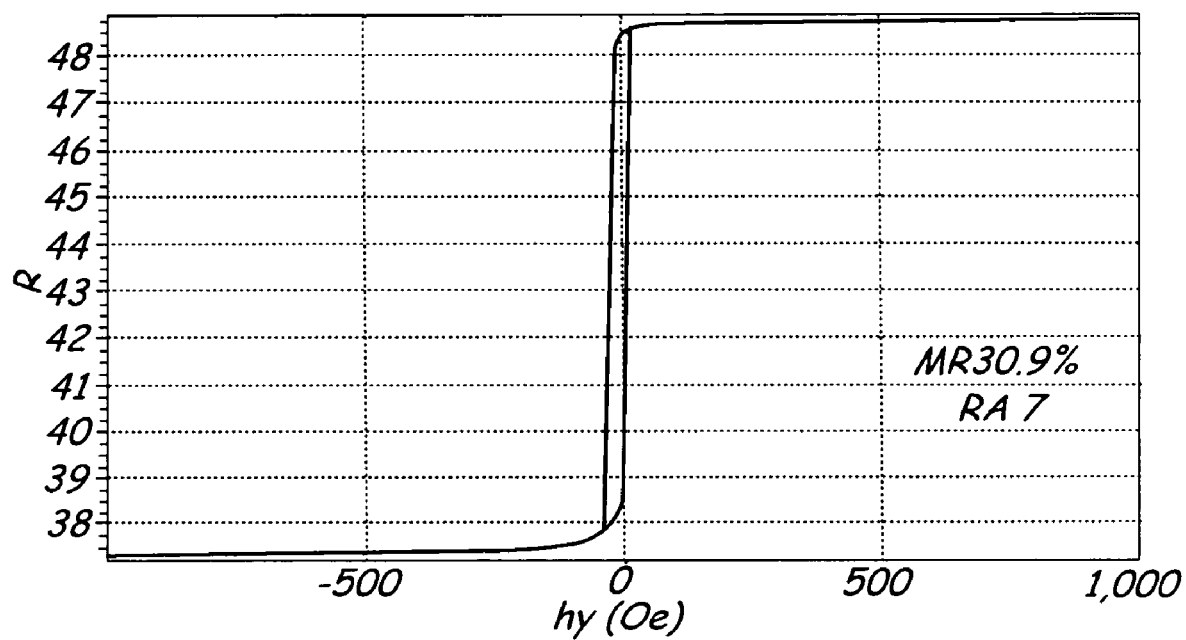
FIGS. 2 and 3 show resistance versus applied magnetic field data for MTJ devices with a 11.5 Å gallium oxide tunneling barrier layer according to an embodiment of the present invention.
Figure 3:
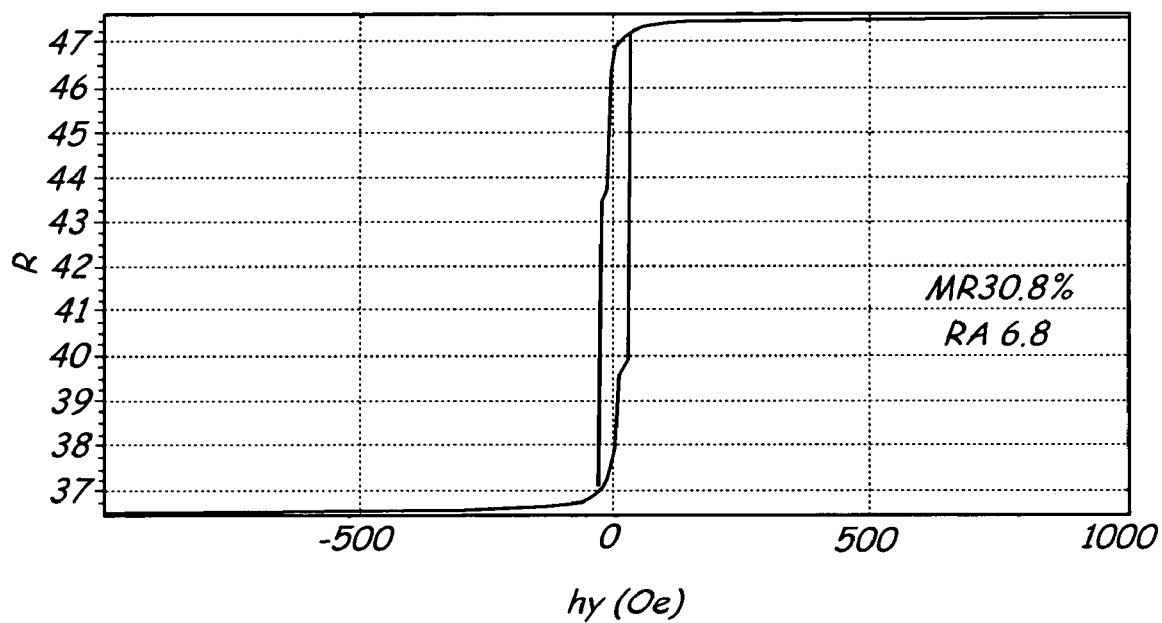

FIGS. 2 and 3 show the resistance versus applied magnetic field for a MTJ device incorporating the invention. The measurements shown in the graphs of FIGS. 2 and 3 are of MTJ devices with a 11.5 Å gallium oxide tunneling barrier layer applied by RF sputtering of gallium oxide. These MTJ devices show a RA product of less than $7\Omega\cdot\mu m^2$, while maintaining a MR ratio of over 30%. This RA product is more than 100,000 times smaller than the RA product achieved in the prior art.

Figure 4:
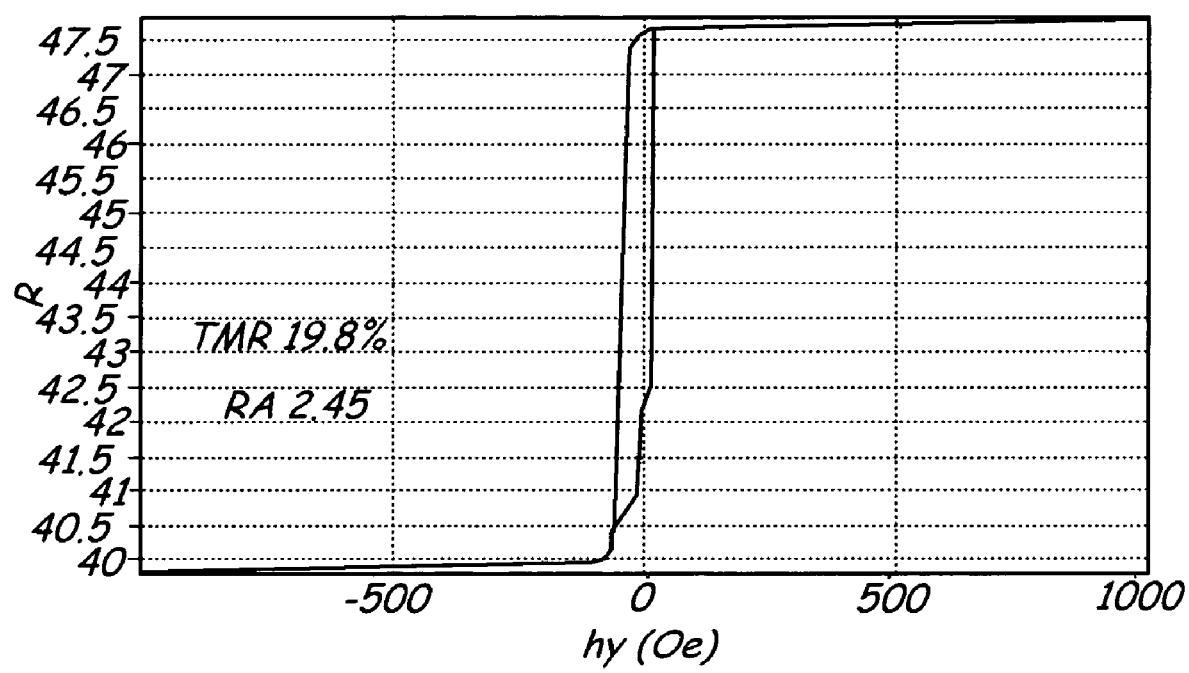
FIG. 4 shows resistance versus applied magnetic field data for a MTJ device with a 10.5 Å gallium oxide tunneling barrier layer according to an embodiment of the present invention.

FIG. 4 shows the resistance versus applied magnetic field for another MTJ device incorporating the invention. The measurements shown in the graph of FIG. 4 are of a MTJ device with a 10.5 Å gallium oxide tunneling barrier layer applied by RF sputtering of gallium oxide. This MTJ device shows a RA product of $2.45\Omega\cdot\mu m^2$, while maintaining a MR ratio of 19.8%. This RA product is more than 300,000 times smaller than the RA product achieved in the prior art.

Figure 5:
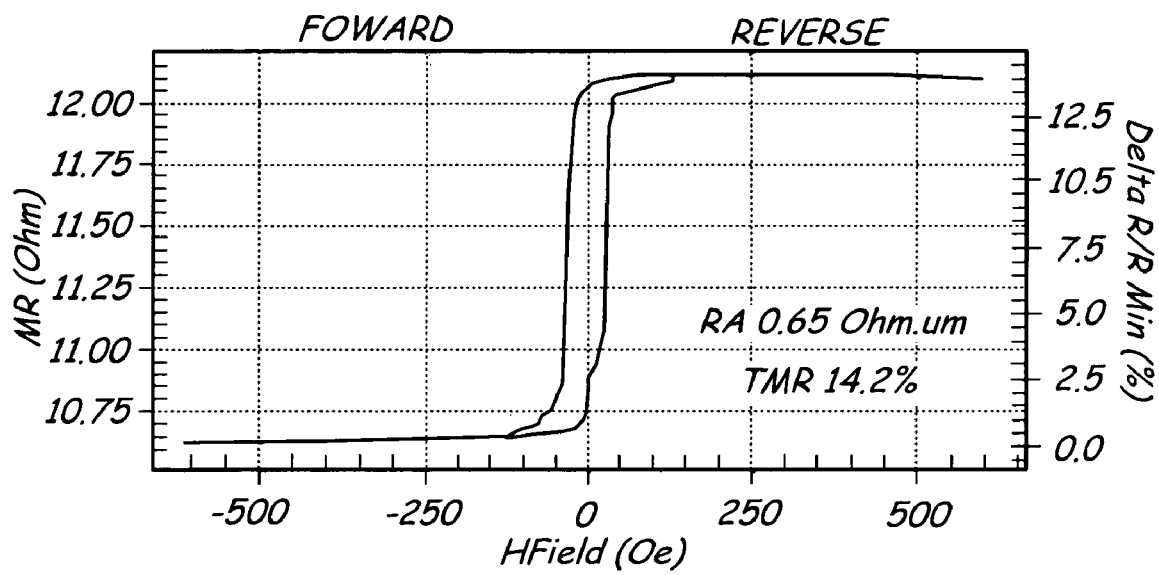
FIG. 5 shows resistance versus applied magnetic field data for a MTJ device with a 9.0 Å gallium oxide tunneling barrier layer according to an embodiment of the present invention.

FIG. 5 shows the resistance versus applied magnetic field for another MTJ device incorporating the invention. The measurements shown in the graph of FIG. 2 are of a MTJ device with a 9.0 Å gallium oxide tunneling barrier layer applied by RF sputtering of gallium oxide. This MTJ device shows a RA product of $0.65\Omega\cdot\mu m^2$, while maintaining a MR ratio of over 14%. This RA product is more than 900,000 times smaller than the RA product achieved in the prior art.

Figure 6:
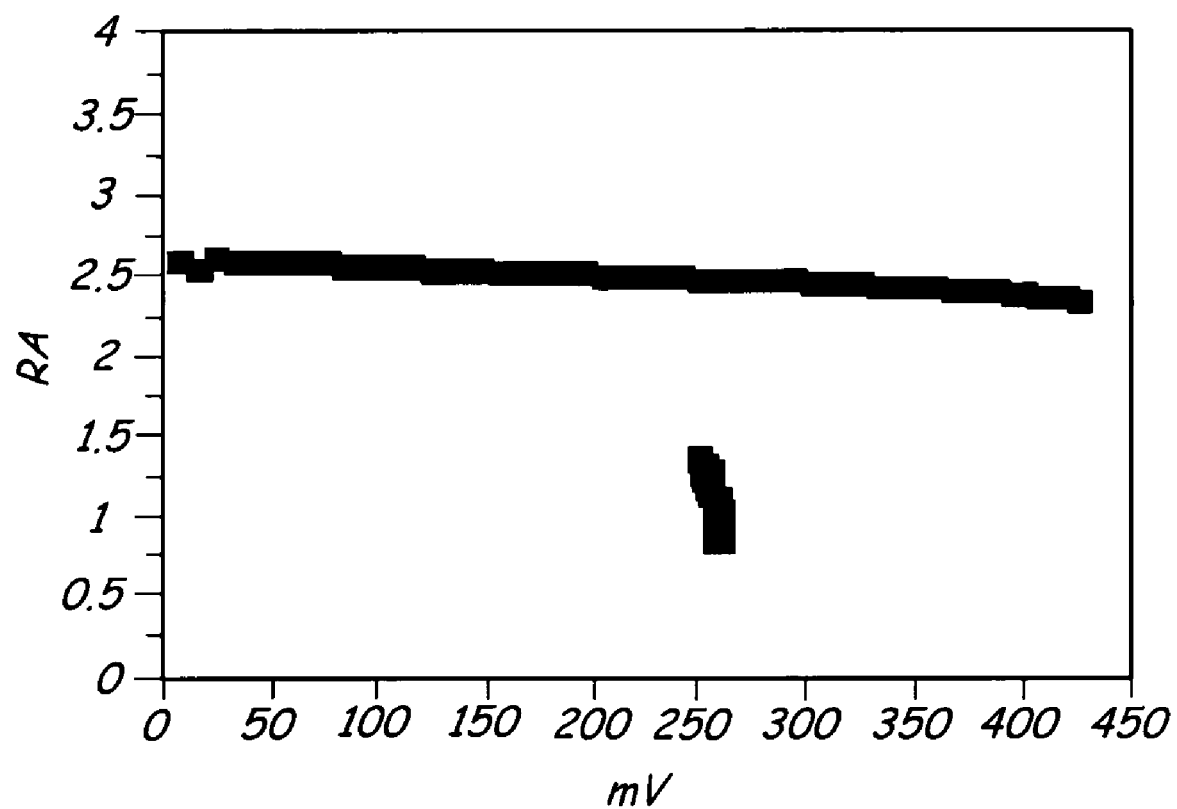
FIG. 6 shows the breakdown curve of a MTJ device with a 10.5 Å gallium oxide tunneling barrier layer according to an embodiment of the present invention.

FIG. 6 shows the breakdown curve of a MTJ device with a gallium oxide barrier. The breakdown voltage depends on the RA product and the thickness of the barrier. The measurements shown in the graph of FIG. 6 are of a MTJ device with a 10.5 Å gallium oxide tunneling barrier layer applied by RF sputtering of gallium oxide. Breakdown voltage of more than 400 mV is observed for devices having RA products as low as $2-3\Omega\cdot\mu m^2$.

Recording heads require MTJ devices with substantially lower RA products than available in the prior art. Deposition of a gallium oxide tunneling barrier layer by RF sputtering results in MTJ devices with RA products of less than $7\Omega\cdot\mu m^2$, while maintaining sufficiently high MR ratios for use in recording heads and other applications.

Although the present invention has been described with reference to preferred embodiments, workers skilled in the art will recognize that changes may be made in form and detail without departing from the spirit and scope of the invention.

We claim:

1. A magnetic tunneling junction device comprising:
   a fixed ferromagnetic layer;
   a free ferromagnetic layer; and
   an insulating tunneling barrier layer comprised of gallium oxide and located between and in contact with the fixed and free ferromagnetic layers;
   wherein the magnetic tunneling junction device has a resistance area (RA) product less than $7\ \Omega\cdot\mu m^2$; and has a magnetoresistance (MR) ratio of at least 30% at room temperature.

2. The magnetic tunneling junction device of claim 1 wherein the magnetic tunneling junction device is a read head.

3. The magnetic tunneling junction device of claim 1 wherein the magnetic tunneling junction device is a magnetic memory cell.

4. The magnetic tunneling junction device of claim 1 wherein the tunneling barrier layer is fabricated by radio-frequency (RF) sputtering of gallium oxide.

5. The magnetic tunneling junction device of claim 1 wherein the free ferromagnetic layer is made of one or more materials selected from the group consisting of: Fe, Co, CoNiFe, NiFe, CoFe, and CoNiB.

6. The magnetic tunneling junction device of claim 1 wherein the magnetic tunneling junction device has a RA product less than $3\ \Omega\cdot\mu m^2$.

7. The magnetic tunneling junction device of claim 6 wherein the magnetic tunneling junction device has a MR ratio of at least 19% at room temperature.

8. The magnetic tunneling junction device of claim 6 wherein the magnetic tunneling junction device is a read head.

9. The magnetic tunneling junction device of claim 6 wherein the magnetic tunneling junction device is a magnetic memory cell.

10. The magnetic tunneling junction device of claim 6 wherein the tunneling baffler layer is fabricated by RF sputtering of gallium oxide.

11. The magnetic tunneling junction device of claim 6 wherein the free ferromagnetic layer is made of one or more materials selected from the group consisting of: Fe, Co, CoNiFe, NiFe, CoFe, and CoNiB.

12. The magnetic tunneling junction device of claim 1 wherein the magnetic tunneling junction device has a RA product less than 1 $\Omega \cdot \mu m^2$.

13. The magnetic tunneling junction device of claim 12 wherein the magnetic tunneling junction device has a MR ratio of at least 14% at room temperature.

14. The magnetic tunneling junction device of claim 12 wherein the magnetic tunneling junction device is a read head.

15. The magnetic tunneling junction device of claim 12 wherein the magnetic tunneling junction device is a magnetic memory cell.

16. The magnetic tunneling junction device of claim 12 wherein the tunneling barrier layer is fabricated by RF sputtering of gallium oxide.

17. The magnetic tunneling junction device of claim 12 wherein the free ferromagnetic layer is made of one or materials selected from the group consisting of: Fe, Co, CoNiFe, NiFe, CoFe, and CoNiB.

* * * * *